ıı US007668016B2

(12) United States Patent
Sung et al.

(10) Patent No.: US 7,668,016 B2
(45) Date of Patent: Feb. 23, 2010

(54) NON-VOLATILE MEMORY DEVICES AND PROGRAMMING METHODS THEREOF INCLUDING MOVING ELECTRONS THROUGH PAD OXIDE LAYERS BETWEEN CHARGE TRAP LAYERS

(75) Inventors: Jung-hun Sung, Yongin-si (KR);
Kwang-soo Seol, Suwon-si (KR);
Woong-chul Shin, Daejeon (KR);
Sang-jin Park, Pyeongtaek-si (KR);
Sang-moo Choi, Yongin-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 132 days.

(21) Appl. No.: 12/078,141

(22) Filed: Mar. 27, 2008

(65) Prior Publication Data
US 2009/0034341 A1    Feb. 5, 2009

(30) Foreign Application Priority Data
Jul. 31, 2007    (KR) ............... 10-2007-0077175

(51) Int. Cl.
*G11C 16/04* (2006.01)
(52) U.S. Cl. .................. 365/185.28; 365/185.18; 365/185.26
(58) Field of Classification Search ............ 365/185.28, 365/185.18, 185.22
See application file for complete search history.

(56) References Cited
U.S. PATENT DOCUMENTS

| | | | | |
|---|---|---|---|---|
| 4,122,543 A * | 10/1978 | Bert et al. ............... 365/182 |
| 4,717,943 A * | 1/1988 | Wolf et al. ............. 365/185.01 |
| 6,324,099 B1 * | 11/2001 | Iijima ..................... 365/185.24 |
| 6,434,053 B1 * | 8/2002 | Fujiwara ................ 365/185.28 |
| 6,934,194 B2 * | 8/2005 | Takahashi et al. ...... 365/185.29 |
| 7,092,291 B2 * | 8/2006 | Mori ...................... 365/185.18 |
| 7,098,505 B1 * | 8/2006 | Han et al. ............... 365/185.28 |
| 7,474,562 B2 * | 1/2009 | Kuo et al. ............... 365/185.18 |
| 7,508,718 B2 * | 3/2009 | Furnemont ............. 365/185.28 |
| 7,592,666 B2 * | 9/2009 | Noguchi et al. ........ 365/185.33 |
| 2005/0194633 A1 * | 9/2005 | Mori ...................... 365/185.33 |
| 2006/0146603 A1 * | 7/2006 | Kuo et al. ................... 365/177 |
| 2006/0171209 A1 * | 8/2006 | Sim et al. ............... 365/189.01 |
| 2007/0007583 A1 * | 1/2007 | Lee et al. ..................... 257/324 |
| 2007/0064468 A1 * | 3/2007 | Seol et al. ................... 365/129 |
| 2008/0080238 A1 * | 4/2008 | Yuda ...................... 365/185.03 |
| 2008/0266960 A1 * | 10/2008 | Kuo ....................... 365/185.12 |
| 2009/0053871 A1 * | 2/2009 | Ahn ........................... 438/287 |
| 2009/0141563 A1 * | 6/2009 | Furnemont ............. 365/185.28 |

* cited by examiner

*Primary Examiner*—Tuan T. Nguyen
(74) *Attorney, Agent, or Firm*—Harness, Dickey & Pierce, P.L.C.

(57) ABSTRACT

Non-volatile memory devices and methods of programming a non-volatile memory device in which electrons are moved between charge trap layers through a pad oxide layer are provided. The non-volatile memory devices include a charge trap layer on a semiconductor substrate and storing electrons, a pad oxide layer on the first charge trap layer, and a second trap layer on the pad oxide layer and storing electrons. In a programming mode in which data is written, the stored electrons are moved between a first position of the first charge trap layer and a first position of the second charge trap layer through the pad oxide layer or between a second position of the first charge trap layer and a second position of the second charge trap layer through the pad oxide layer.

25 Claims, 7 Drawing Sheets

| | Vth(FIRST) | Vth(SECOND) | CURRENT | DATA |
|---|---|---|---|---|
| FIG. 2A | HIGH | HIGH | I1 = I2 (SMALL) | (0,0) |
| FIG. 2B | LOW | LOW | I1 = I2 (LARGE) | (0,1) |
| FIG. 2C | HIGH | LOW | I1 < I2 | (1,0) |
| FIG. 2D | LOW | HIGH | I1 > I2 | (1,1) |

NON-VOLATILE MEMORY DEVICES AND PROGRAMMING METHODS THEREOF INCLUDING MOVING ELECTRONS THROUGH PAD OXIDE LAYERS BETWEEN CHARGE TRAP LAYERS

PRIORITY STATEMENT

This application claims the benefit of priority under 35 U.S.C. §119 from Korean Patent Application No. 10-2007-0077175, filed on Jul. 31, 2007, in the Korean Intellectual Property Office, the disclosure of which is incorporated herein in its entirety by reference.

BACKGROUND

1. Field

Example embodiments relate to non-volatile memory devices and methods of programming the same. Other example embodiments relate to non-volatile memory devices that move electrons between charge trap layers and through pad oxide layers. Example embodiments also relate to methods of programming a non-volatile memory device including moving electrons through pad oxide layers between charge trap layers of the same.

2. Description of the Related Art

Non-volatile memory devices, in which data may be electrically erased and programmed, preserve stored data even without a power supply. Such non-volatile memory devices include, for example, a flash memory.

A flash memory stores data by storing electric charges. Memory cells constituting a flash memory may be composed of cell transistors each including a control gate, a charge storage layer, a source and a drain. The flash memory changes a data value written in the memory cells by regulating electrical charge of the charge storage layer.

A mode in which a threshold voltage of a cell transistor is negative (−) due to negative charges in the charge storage layer is referred to as an erasing mode. A mode in which electrons are injected to the charge storage layer and a threshold voltage of a cell transistor is positive (+) is referred to as a programming mode.

The threshold voltage of the cell transistor may be changed by regulating the electrical charge of the charge storage layer. To regulate the electrical charge of the charge storage layer, hot electrons may be injected to the charge storage layer or may be ejected from the charge storage layer. If the hot electrons are injected or ejected, oxide in the charge storage layer may deteriorate.

SUMMARY

Example embodiments relate to non-volatile memory devices and methods of programming the same. Other example embodiments relate to non-volatile memory devices that move electrons between charge trap layers and through pad oxide layers. Example embodiments also relate to methods of programming a non-volatile memory device including moving electrons through pad oxide layers between charge trap layers of the same.

According to example embodiments, there is provided a non-volatile memory device including a charge trap layer formed (or disposed) on a semiconductor substrate and storing electrons, a pad oxide layer formed (or disposed) on the first charge trap layer, and a second trap layer formed (or disposed) on the pad oxide layer and storing electrons. In a programming mode in which data is written, electrons may be moved between a first edge of the first charge trap layer and a first edge of the second charge trap layer through the pad oxide layer and/or electrons may be moved between a second edge of the first charge trap layer and a second edge of the second charge trap layer through the pad oxide layer. The electrons may be separately moved between the first edge and second edge of the first and second charge trap layers.

The first edges of the first and second charge trap layers may correspond to a first semiconductor substrate position. The device may include a first doping region formed in the first semiconductor substrate position.

The second edges of the first and second charge trap layers may correspond to a second semiconductor substrate position. The device may include a second doping region formed in the second semiconductor substrate position.

A first voltage less than a control gate voltage may be applied to the first doping region in order to move electrons from the first edge of the first charge trap layer to the first edge of the second charge trap layer. The first voltage may be applied to the second doping region to move electrons from the second edge of the first charge trap layer to the second edge of the second charge trap layer. The first voltage may be applied to a third semiconductor substrate position corresponding to a center of the semiconductor substrate to move electrons from the first and second edges of the first charge trap layer to the first and second edges of the second charge trap layer.

The first voltage may be a ground voltage. One of the first, second and third semiconductor substrate positions, to which the first voltage is not applied, may be floated.

In a reading mode in which data written in the non-volatile memory device is read, a data value may be detected by comparing a first current flowing in a first direction of the semiconductor substrate with a second current flowing in a second direction opposite to the first direction.

BRIEF DESCRIPTION OF THE DRAWINGS

Example embodiments will be more clearly understood from the following detailed description taken in conjunction with the accompanying drawings. FIGS. 1-7D represent non-limiting, example embodiments as described herein.

DETAILED DESCRIPTION OF THE EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to non-volatile memory devices and methods of programming the same. Other example embodiments relate to non-volatile memory devices that move electrons between charge trap layers and through pad oxide layers. Example embodiments also relate to methods of programming a non-volatile memory device including moving electrons through pad oxide layers between charge trap layers of the same.

A first edge and a second edge are respectively assumed to be a left edge and a right edge for convenience of description. However, example embodiments are not limited thereto.

Figure 1:
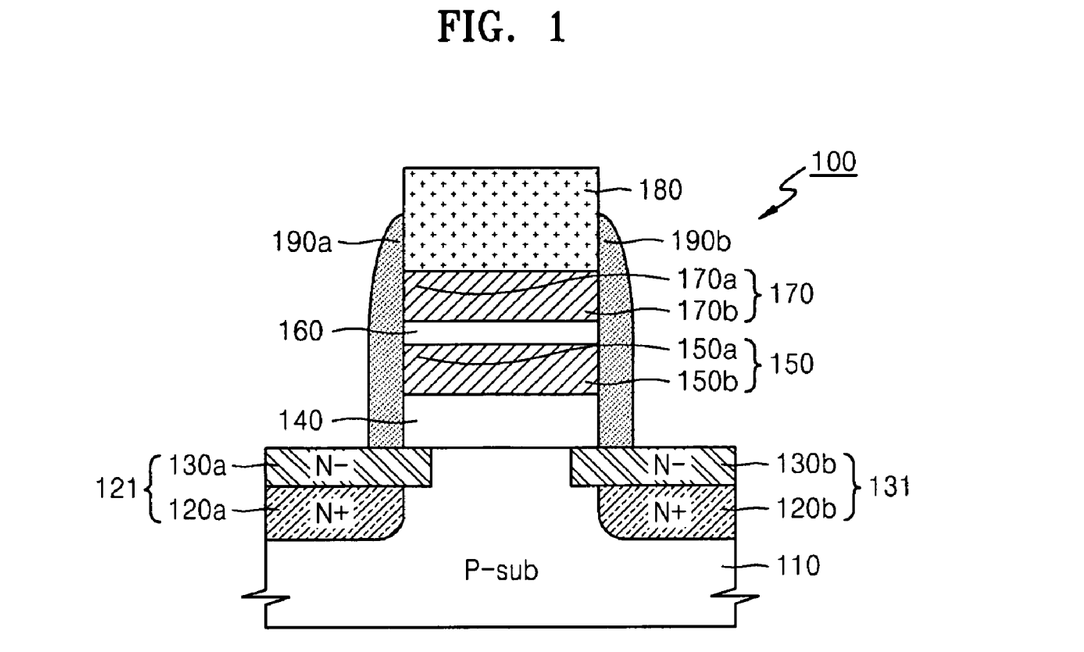
FIG. 1 is a diagram illustrating a cross-sectional view of a non-volatile memory device according to example embodiments.

FIG. 1 is a diagram illustrating a cross-sectional view of a non-volatile memory device 100 according to example embodiments.

Referring to FIG. 1, the non-volatile memory device 100 includes a semiconductor substrate 110, a first charge trap layer 150, a pad oxide layer 160 and a second charge trap layer 170. The first charge trap layer 150, the pad oxide layer 160 and the second charge trap layer 170 may be sequentially formed on the semiconductor substrate 110. The pad oxide layer 160 may be formed between the first charge trap layer 150 and the second charge trap layer 170.

In the non-volatile memory device 100, electrons are moved or not moved between the first charge trap layer 150 and the second charge trap layer 170 through the pad oxide layer 160.

In a programming mode, the non-volatile memory device 100 may separately move or not move the electrons between a first edge 150a of the first charge trap layer 150 and a first edge 170a of the second charge trap layer 170 and a second edge 150b of the first charge trap layer 150, and a second edge 170b of the second charge trap layer 170. The electrons may be moved between the first edge 150a of the first charge trap layer 150 and the first edge 170a of the second charge trap layer 170 through the pad oxide layer 160. The electrons may be moved between the second edge 150b of the first charge trap layer 150 and the second edge 170b of the second charge trap layer 170.

According to example embodiments, the electrons may be moved between the first edges 150a and 170a of the first charge trap layer 150 and the second charge trap layer 170 and the second edges 150b and 170b of the first charge trap layer 150 and the second charge trap layer 170. According to other example embodiments, the electrons may not be moved between the first edges 150a and 170a and the second edges 150b and 170b of the first charge trap layer 150 and the second charge trap layer 170.

By separately moving the electrons between the first edges 150a and 170a of the first charge trap layer 150 and the second charge trap layer 170 and the second edges 150b and 170b of the first charge trap layer 150 and the second charge trap layer 170, threshold voltages of the first and second edges may be separately controlled. If the electrons are not moved between the first edge 150a of the first charge trap layer 150 and the first edge 170a of the second charge trap layer 170, the threshold voltage of first edge of the device 100 increases because there are electrons both in the first edge 150a of the first charge trap layer 150 and the first edge 170a of the second charge trap layer 170.

If the electrons in the first edge 150a of the first charge trap layer 150 are moved to the first edge 170a of the second charge trap layer 170, the threshold voltage of the first edge of the device 100 decreases because the electrons are not in the first edge 150a of the first charge trap layer 150 and the electrons are in the first edge 170a of the second charge trap layer 170. The threshold voltage of the second edge may be selectively controlled to be substantially high or substantially low.

A programming operation of the non-volatile memory device 100 shown in FIG. 1 will be described with reference to FIGS. 2A through 2D.

FIGS. 2A through 2D are diagrams illustrating cross-sectional views of programming and reading operations of the non-volatile memory device 100 of FIG. 1.

Figure 2A:
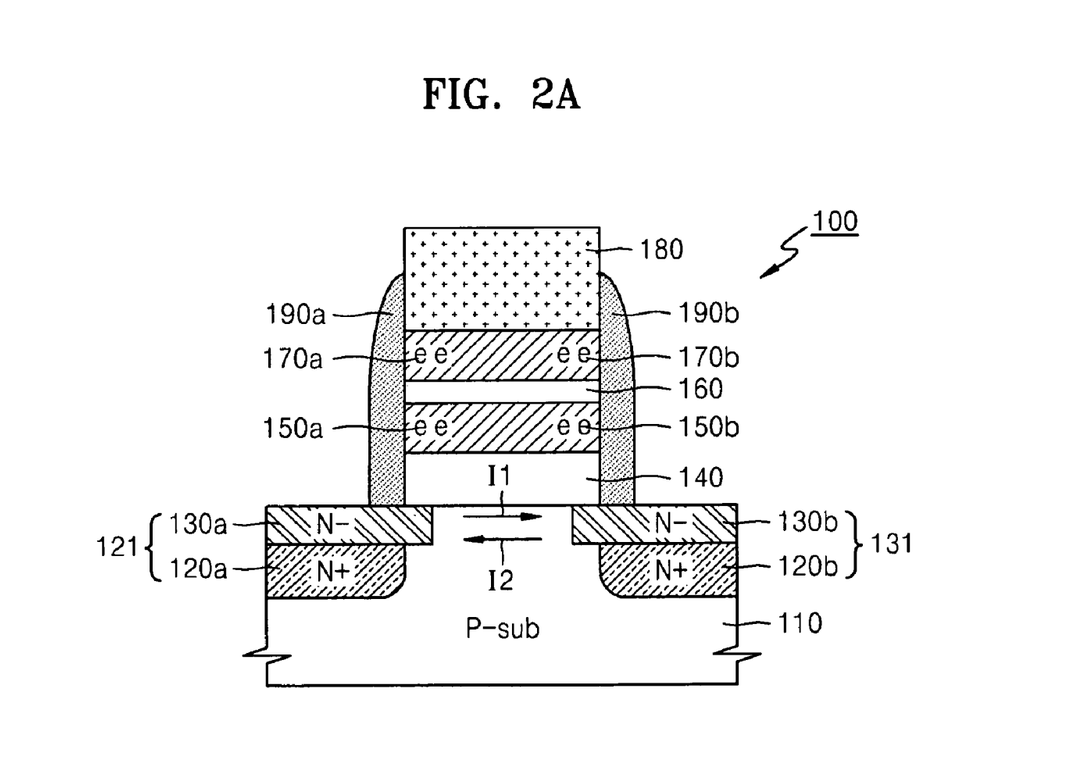
FIGS. 2A through 2D are diagrams illustrating cross-sectional views of programming and reading operations of the non-volatile memory device shown in FIG. 1.

FIG. 2A is a diagram illustrating cross-sectional view of the non-volatile memory device 100 in which electrons are not moved between the first edges 150a and 170a and the second edges 150b and 170b.

Referring to FIG. 2A, because the electrons are both in the first edge 150a of the first charge trap layer 150 and the first edge 170a of the second charge trap layer 170, the threshold voltage of the first edge of the device 100 may be substantially high. Because the electrons are in the second edge 150b of the first charge trap layer 150 and the second edge 170b of the second charge trap layer 170, the threshold voltage of the second edge of the device 100 may be substantially high. In FIG. 2A, both threshold voltages of the first edge and the second edge of the device 100 may be substantially high.

Figure 2B:
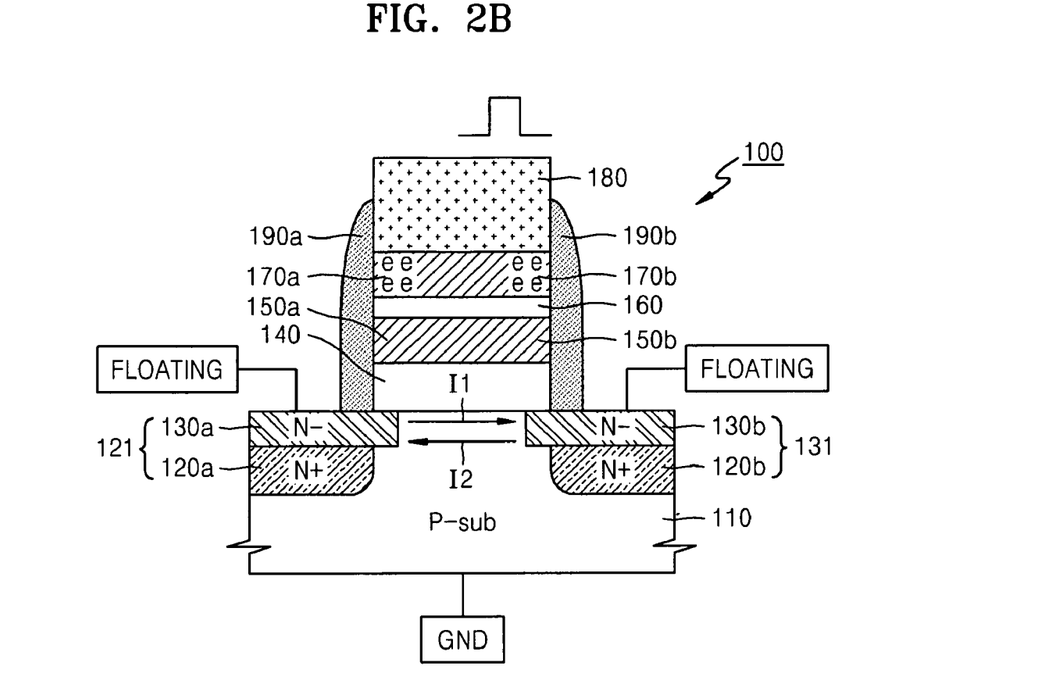

FIG. 2B is a diagram illustrating a cross-sectional view of the non-volatile memory device 100 in which electrons are moved between the first edge 150a and 170a and the second edge 150b and 170b.

Referring to FIG. 2B, the electrons are not in the first edge 150a and the second edge 150b of the first charge trap layer 150 and electrons are in the first edge 170a and the second edge 170b of the second charge trap layer 170. In FIG. 2B, both threshold voltages of the first edge and the second edge of the device 100 may be substantially low.

Figure 2C:
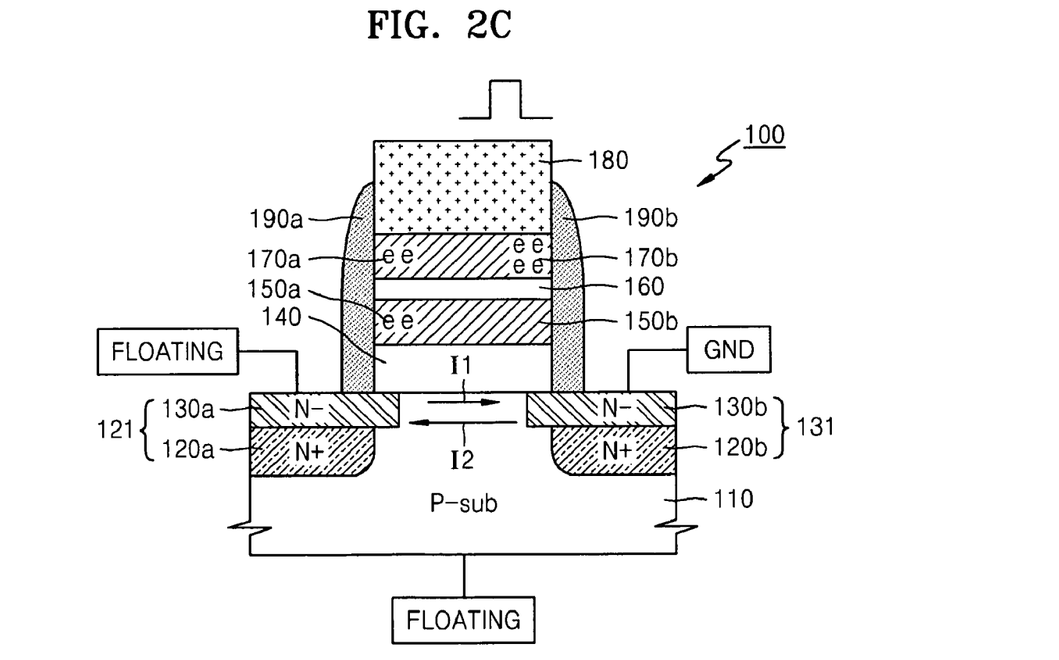

FIG. 2C is a diagram illustrating a cross-sectional view of the non-volatile memory device 100 in which electrons are moved from the second edge 150b of the first charge trap layer 150 to the second edge 170b of the second charge trap layer 170 and electrons are not moved between the first edges 150a and 170a.

Referring to FIG. 2C, because electrons are both in the first edge 150a of the first charge trap layer 150 and the first edge 170a of the second charge trap layer 170, the threshold voltage of the first edge of the device 100 may be substantially high. Because electrons are not in the second edge 150b of the first charge trap layer 150 and electrons are in the second edge 170b of the second charge trap layer 170, the threshold voltage of the second edge of the device 100 may be substantially low.

Figure 2D:
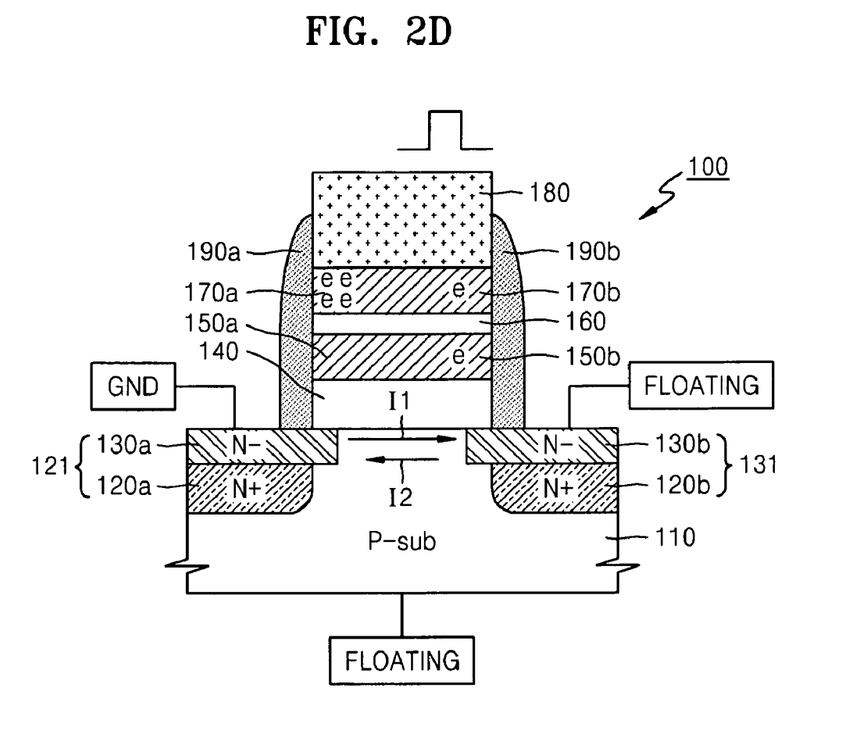

FIG. 2D is a diagram illustrating a cross-sectional view of the non-volatile memory device 100 in which electrons are moved from the first edge 150a of the first charge trap layer 150 to the first edge 170a of the second charge trap layer 170 and electrons are not moved between the second edges 150b and 170b.

Referring to FIG. 2D, because electrons are not in the first edge 150a of the first charge trap layer 150 and electrons are in the first edge 170a of the second charge trap layer 170, the threshold voltage of the first edge of the device 100 may be substantially low. Because electrons are both in the second edge 150b of the first charge trap layer 150 and the second edge 170b of the second charge trap layer 170, the threshold voltage of the second edge of the device 100 may be substantially high.

In the non-volatile memory device 100 of FIG. 1, electrons may be separately moved between the first edge and the second edge. As such, the threshold voltages of the first edge and the second edge may be separately controlled.

Because each of the threshold voltages of the first edge and the second edge may be high or low, there are four logic combinations of the threshold voltages of the first edge and the second edge. As such, the non-volatile memory device 100 may store 2-bit data using the four logic combinations.

Figure 3:
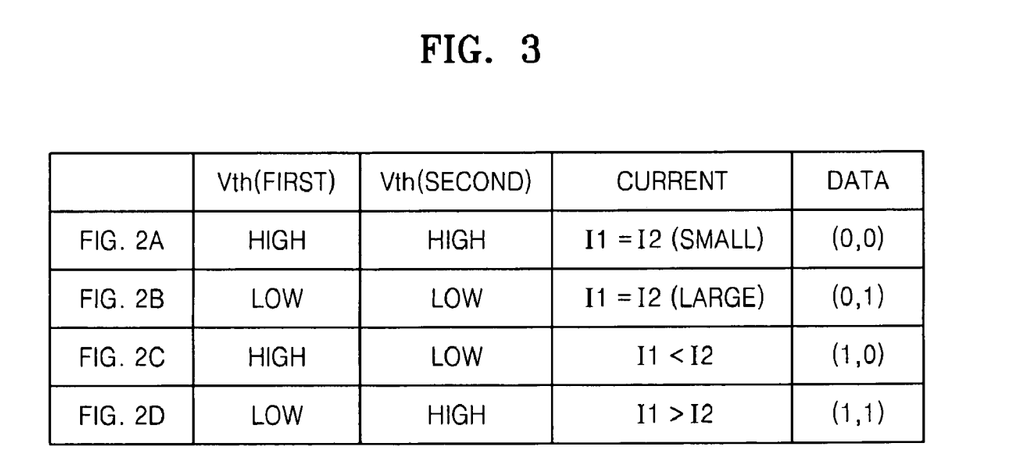
FIG. 3 is a table showing the results of programming and reading operations described with reference to FIGS. 2A through 2D.

FIG. 3 is a table showing the results of programming and reading operations described with reference to FIGS. 2A through 2D.

In FIG. 3, the four logic combinations in FIGS. 2A through 2D may correspond to data (0, 0), (0, 1), (1, 0) and (1,1), respectively.

To separately move electrons between the first edge and the second edge, the non-volatile memory device 100 may apply a first voltage lower than a control gate voltage to a predetermined position of the semiconductor substrate 110. The control gate voltage may have a positive value. The first voltage may be a ground voltage. The control gate voltage and the first voltage may have other voltage levels.

If the first voltage lower than the control gate voltage is applied to the semiconductor substrate 110, a potential difference may be generated between positions to which the first voltage and the control gate voltage are respectively applied. The electrons, in the positions to which the first voltage was applied, may be moved from a lower part to an upper part of the semiconductor substrate 110.

The first voltage may be applied to a first semiconductor substrate position (e.g., a left position) of the semiconductor substrate 110, a second semiconductor substrate position (e.g., a right position) of the semiconductor substrate 110 or a third semiconductor substrate position (e.g., a central position) of the semiconductor substrate 110.

The first semiconductor substrate position may correspond to the first edge 150a of the first charge trap layer 150 and the first edge 170a of the second charge trap layer 170. The second semiconductor substrate position may correspond to the second edge 150b of the first charge trap layer 150 and the second edge 170b of the second charge trap layer 170. The third semiconductor substrate position may correspond to a center of the semiconductor substrate 110.

The first voltage may be applied to one of the first semiconductor substrate position, the second semiconductor substrate position and the third semiconductor substrate position.

The first semiconductor substrate position may be a first doping region 121. The second semiconductor substrate position may be a second doping region 131.

Referring to FIGS. 1 and 2, the first doping region 121 may be formed on a side of the semiconductor substrate 110 corresponding to the first edges 150a and 170a of the first and second charge trap layers 150 and 170. The second doping region 131 may be formed on a side of the semiconductor substrate 110 corresponding to the second edges 150b and 170b of the first and second charge trap layers 150 and 170. The third semiconductor substrate position may be the central part of the lower end of the semiconductor substrate 110.

The first semiconductor substrate position and the second semiconductor substrate position may not be the doping regions 121 and 131. The first semiconductor substrate position and the second semiconductor substrate position may be predetermined positions of a portion of first and second edges of the semiconductor substrate 110. For convenience of description, the first semiconductor substrate position and the second substrate position are assumed to be the first doping region 121 and the second doping region 131. The first voltage is assumed to be a ground voltage.

Referring to FIGS. 2A through 2D, by applying the first voltage to a predetermined position of the semiconductor substrate 110, electrons may be separately moved between the first edge and the second edge of the substrate 110.

FIG. 2A illustrates the non-volatile memory device 100 where the first voltage is not applied to the semiconductor substrate 110. In FIG. 2A, electrons in the first charge trap layer 150 are not moved to the second charge trap layer 170.

FIG. 2B illustrates the non-volatile memory device 100 where the first voltage (ground voltage) is applied to the third semiconductor substrate position. In FIG. 2B, because the third semiconductor substrate position is the center of the semiconductor substrate 110, electrons in the first edge 150a and the second edge 150b of the first charge trap layer 150 are moved to the first edge 170a and the second edge 170b of the second charge trap layer 170 due to a potential difference between the control gate voltage and the first voltage (ground voltage) applied to the center of the semiconductor substrate 110.

FIG. 2C illustrates the non-volatile memory device 100 where the first voltage (ground voltage) is applied to the second doping region 131. In FIG. 2C, electrons in the second edge 150b of the first charge trap layer 150 are moved to the second edge 170b of the second charge trap layer 170. Electrons in the first edge 150a of the first charge trap layer 150 are not moved to the first edge 170a of the second charge trap layer 170.

FIG. 2D illustrates the non-volatile memory device 100 where the first voltage (ground voltage) is applied to the first doping region 121. In FIG. 2D, electrons in the first edge 150a of the first charge trap layer 150 are moved to the first edge 170a of the second charge trap layer 170. The electrons in the second edge 150b of the first charge trap layer 150 are not moved to the second edge 170b of the second charge trap layer 170.

The non-volatile memory device 100 may float positions to which the first voltage is not applied. For example, in FIG. 2D, if the first voltage is applied to the first doping region 121, the second doping region 131 and the central part of the lower end of the semiconductor substrate 110 may be floated.

The first doping region 121 may include a first high doping region 120a and a first low doping region 130a. The second doping region 131 may include a second high doping region 120b and a second low doping region 130b. The first voltage may be applied to the first low doping region 130a and the second low doping region 130b.

In the non-volatile memory device 100, electrons may tunnel through the pad oxide layer 160 in order to move between the first charge trap layer 150 and the second charge trap layer 170.

Figure 4A:
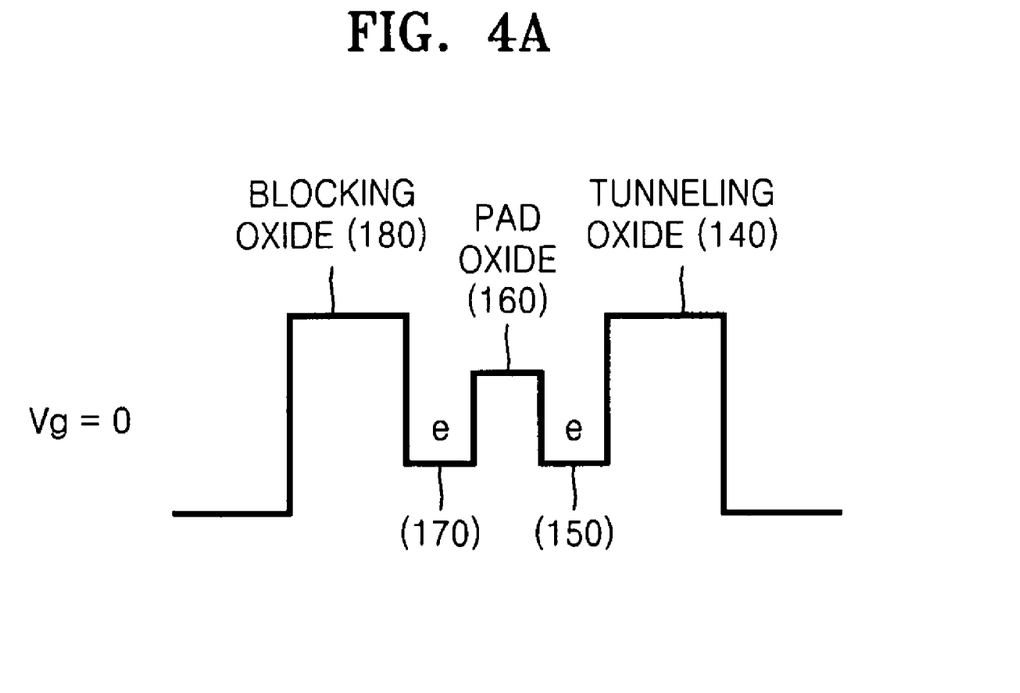
FIGS. 4A and 4B are band diagrams of electrons moved in a programming operation of the non-volatile memory device shown in FIG. 1.
Figure 4B:
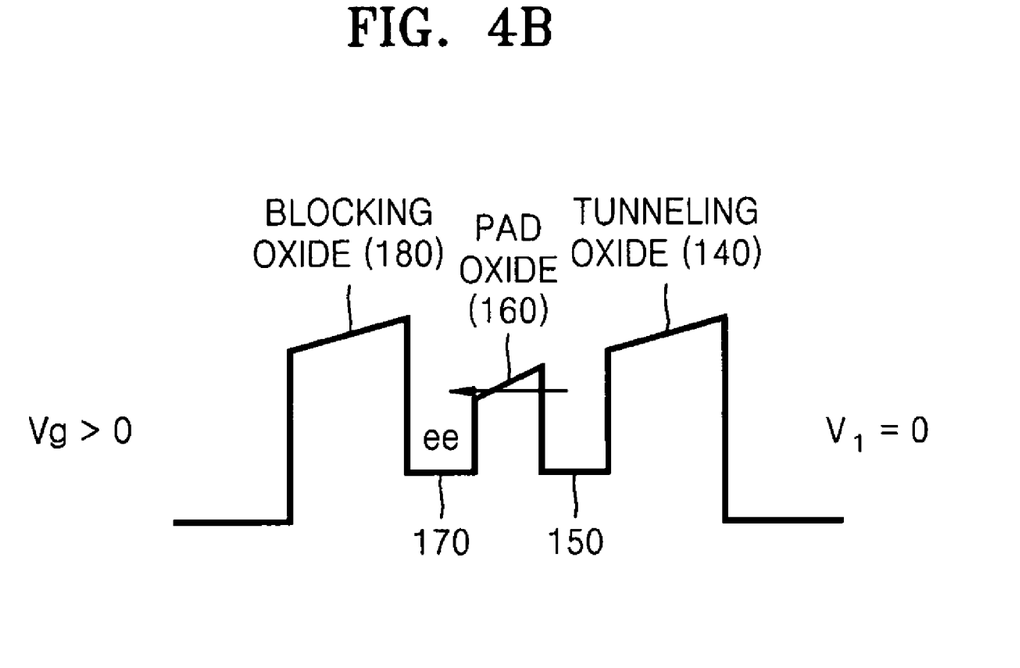

FIGS. 4A and 4B are band diagrams for the non-volatile memory device 100 in which electrons are moved in programming operations described with reference to FIGS. 2A through 2D according to example embodiments.

Referring to FIG. 4A, if the control gate voltage Vg is maintained at 0 V and a first voltage V 1 is not applied, the electrons stay in the first charge trap layer 150 and the second charge trap layer 170.

Referring to FIG. 4B, if the control gate voltage Vg is applied and the first voltage V1 is maintained at 0V, the electrons in the first charge trap layer 150 tunnel through the pad oxide layer 160. As such, the electrons in the first charge trap layer 150 may be moved to the second charge trap layer 170.

In the non-volatile memory device illustrated in FIG. 1, the electrons may be moved between the first charge trap layer 150 and the second charge trap layer 170 through the pad oxide layer 160. The non-volatile memory device performs a programming operation using charge-transition performed through the pad oxide layer 160. If the programming operation is performed using hot-electron injection or hot-hole injection, a tunneling oxide layer 140 between the semiconductor substrate 110 and the first charge trap layer 150 quickly deteriorates and the power consumption of the non-volatile memory device increases.

The non-volatile memory device may perform the programming operation through the pad oxide layer 160 using charge-transition. As such, deterioration of the tunneling oxide layer 140 may be reduced (or prevented) and the power consumption of the non-volatile memory device may decrease.

In example embodiments, the semiconductor substrate 110 is a p-type semiconductor substrate. The first doping region 121 and the second doping region 131 are doped with an n-type semiconductor. However, example embodiments are not limited thereto. It should be understood by one of ordinary skill in the art that the semiconductor substrate 110 that the first doping region 121 and the second doping region 131 may have various conductivity types.

The non-volatile memory device illustrated in FIG. 1 may include a blocking oxide layer 180 and spacers 190a and 190b.

Hereinafter, a reading mode of the non-volatile memory device of FIG. 1 according to example embodiments will be described with reference to FIGS. 2A through 2D, and 3.

For convenience of description, a direction from the first edge to the second edge is referred to as a first direction and a direction from the second edge to the first edge is referred to as a second direction. However, the first direction and the second direction are not limited thereto. For example, the first direction and the second direction may be reversed.

In the reading mode in which programmed data is read, a first current I1 flows in the first direction and a second current I2 flows in the second direction in the semiconductor substrate 110. The second direction may be opposite to the first direction. Based on the levels of the first and second currents I1 and I2, a programmed data value may be detected.

Referring to FIG. 2A, if both the threshold voltages of the first and second edges are substantially high, both the first current I1 flowing in the first direction and the second current I2 flowing in the second direction are substantially low.

Referring to FIG. 2B, if both the threshold voltages of the first and second edges are substantially low, both the first current I1 flowing in the first direction and the second current I2 flowing in the second direction are substantially high.

Referring to FIG. 2C, if the threshold voltage of the first edge is substantially high and the threshold voltage of the second edge is substantially low, the first current I1 flowing in the first direction is substantially low and the second current I2 flowing in the second direction is substantially high.

Referring to FIG. 2D, if the threshold voltage of the first edge is substantially low and the threshold voltage of the second edge is substantially high, the first current I1 flowing in the first direction is substantially high and the second current I2 flowing in the second direction is substantially low.

The table of FIG. 3 shows the first current I1 and the second current I2 according to the threshold voltages of the first and second edges.

Figure 5A:
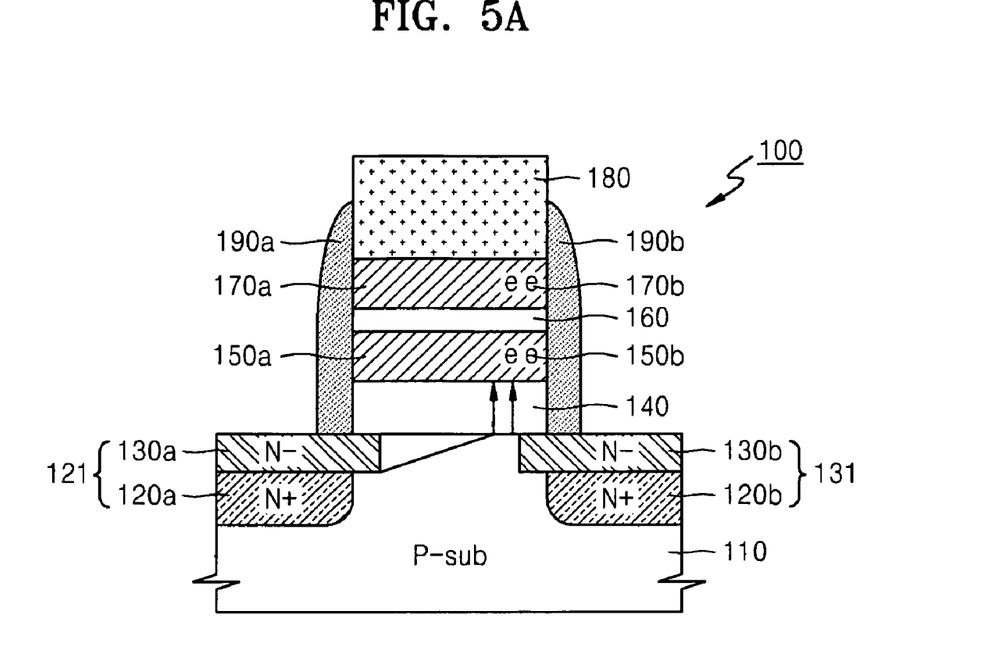
FIGS. 5A and 5B are diagrams illustrating cross-sectional views a method of injecting electrons to first and second charge trap layers of the non-volatile memory device shown FIG. 1.
Figure 5B:
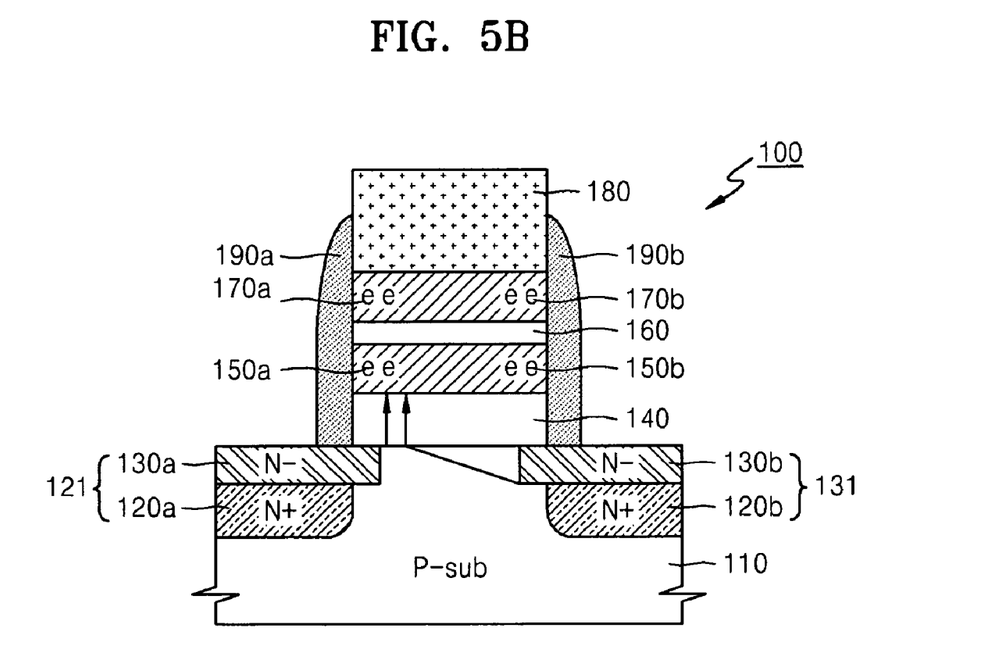

FIGS. 5A and 5B are diagrams illustrating cross-sectional views of a method of injecting electrons to the first and second charge trap layers 150 and 170 of the non-volatile memory device shown in FIG. 1.

To inject electrons, the non-volatile memory device 100 uses the tunneling oxide layer 140. The tunneling oxide layer 140 may be formed on the semiconductor substrate 110 and below the first charge trap layer 150.

In an initial mode prior to the programming mode, the non-volatile memory device 100 injects electrons through the tunneling oxide layer 140 from the semiconductor substrate 110 to the first charge trap layer 150 and the second charge trap layer 170. The non-volatile memory device 100 may inject electrons using channel hot electron injection (CHEI).

The non-volatile memory device 100 may inject electrons from the semiconductor substrate 110 to the second edges 150b and 170b of the first and second charge trap layers 150 and 170. The electrons from the semiconductor substrate 110 may be subsequently injected to the first edge 150a and 170a of the first and second charge trap layers 150 and 170.

FIG. 5A illustrates the non-volatile memory device 100 in which electrons are injected to the second edge. FIG. 5B illustrates the non-volatile memory device in which electrons are injected to the first edge after electrons are injected to the second edge. However, example embodiments are not limited thereto. Electrons may be first injected to the first edge, and subsequently injected to the second edge.

The state in which all electrons are injected in FIG. 5B is the same as a state illustrated in FIG. 2A. The non-volatile memory device 100 may perform the programming operation by injecting electrons to the first charge trap layer 150 and the second charge trap layer 170 in the initial mode prior to the programming mode and subsequently by moving the injected electrons between the first charge trap layer 150 and the second charge trap layer 170.

The non-volatile memory device 100 may apply a positive control gate voltage in order to perform the programming operation. The non-volatile memory device 100 may apply a negative control gate voltage in order to perform an erasing operation. If the control gate voltage is negative, the electrons in the second charge trap layer 170 may be moved to the first charge trap layer 150. As such, the non-volatile memory device 100 returns to a state prior to the programming operation, which is illustrated in FIGS. 2A and 5B.

Figure 6:
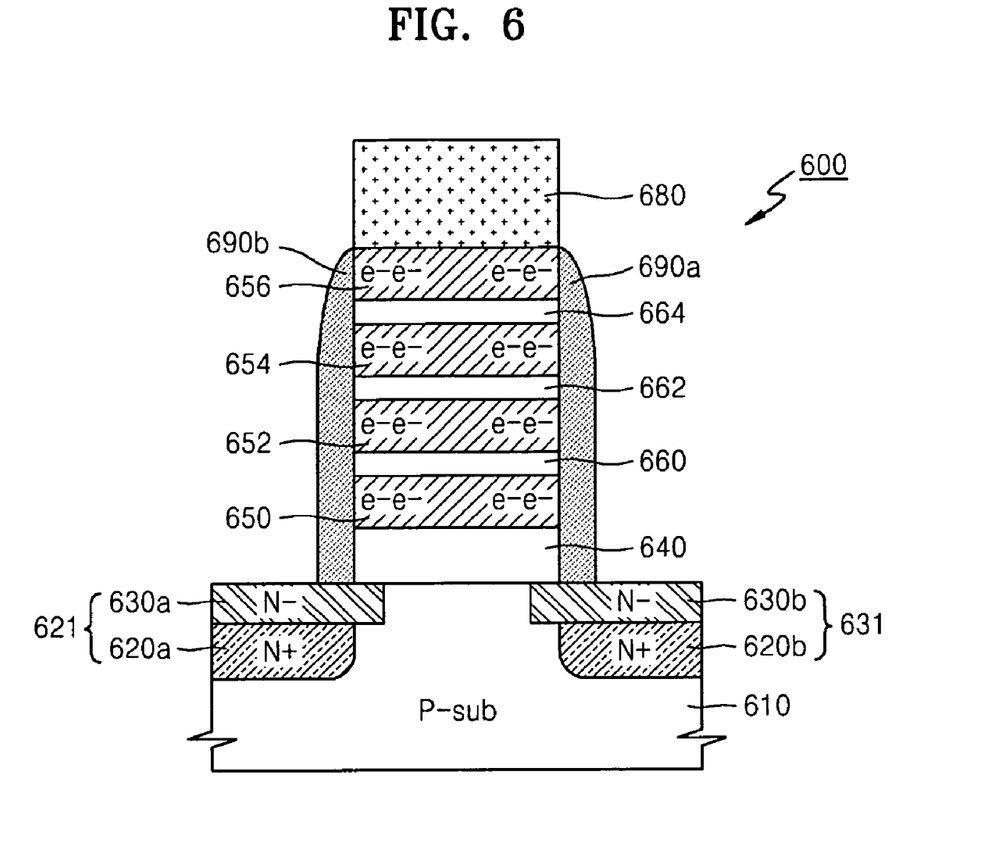
FIG. 6 is a diagram illustrating a cross-sectional view of a non-volatile memory device according to example embodiments.

FIG. 6 is a diagram illustrating a cross-sectional view of a non-volatile memory device 600 according to example embodiments.

The non-volatile memory device 100 includes the first and second charge trap layers 150 and 170 and the pad oxide layer 160 formed between the first and second charge trap layers 150 and 170.

Referring to FIG. 6, the non-volatile memory device 600 according to example embodiments includes first, second, third and fourth charge trap layers 650, 652, 654 and 656. The non-volatile memory device 600 includes first, second and third pad oxide layers 660, 662 and 664 respectively formed between adjacent layers of the first, second, third and fourth charge trap layers 650, 652, 654 and 656.

In the non-volatile memory device 600 of FIG. 6, there may be a lower probability of moving electrons through an upper pad oxide layer (e.g., the third pad oxide layer 664) than that of a case in which electrons are moved through a lower pad oxide layer (e.g., the second pad oxide layer 662). In this case, to move electrons through the lower pad oxide layer, a relatively low control gate voltage is applied. Also, to move electrons through the upper pad oxide layer, a relatively high control gate voltage is applied. The movement of electrons through the upper and lower pad oxide layer may be separately controlled by regulating the control gate voltage.

To lower the probability of moving electrons through the upper pad oxide layer, an upper pad oxide layer may have a larger thickness relative to the lower pad oxide layer. For example, the third pad oxide layer 664 may have a larger thickness relative to the second pad oxide layer 662, and the second pad oxide layer 662 may have a larger thickness relative to the first pad oxide layer 660.

Also, the upper pad oxide layer may have a lower permittivity relative to the lower pad oxide layers. For example, the third pad oxide layer 664 may have a lower permittivity relative to the second pad oxide layer 662, and the second pad oxide layer 662 may have a lower permittivity relative to the first pad oxide layer 660.

The non-volatile memory device 600 may have four threshold voltages of the first edge and four threshold voltages of the second edge. As such, the non-volatile memory device 600 may store 16-bit data.

Because electrons are moved through the first, second and third pad oxide layers 660, 662 and 664 between adjacent layers of the first, second, third and fourth charge trap layers 650, 652, 654 and 656 in the non-volatile memory device 600 similarly to the movement of the electrons in the non-volatile memory device 100, descriptions thereof will not be repeated for the sake of brevity.

FIGS. 7A through 7D are band diagrams illustrating electrons moved in programming operations of the non-volatile memory device 600 shown in FIG. 6.

Figure 7A:
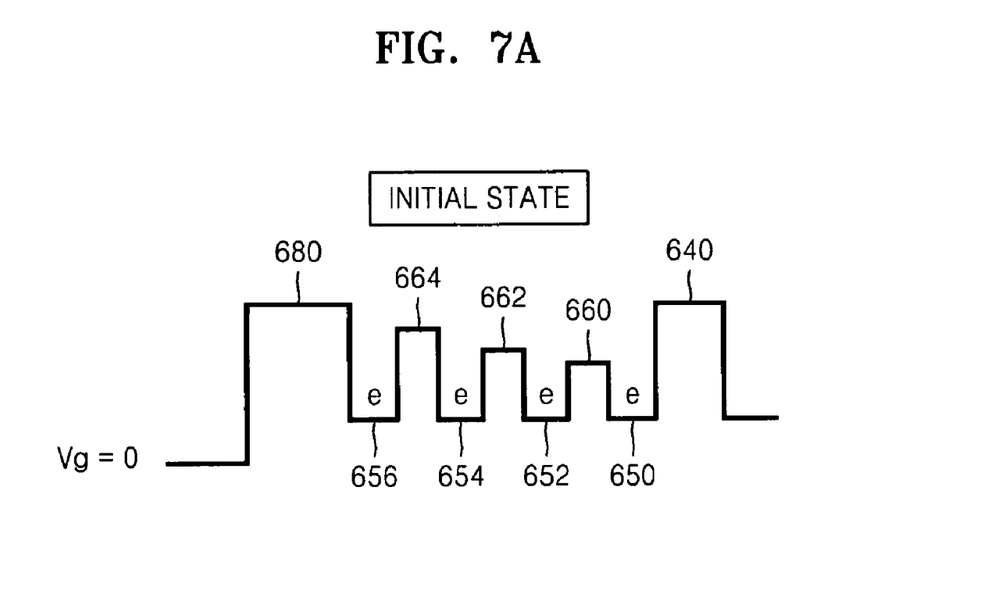
FIGS. 7A through 7D are band diagrams of electrons moved in a programming operation of the non-volatile memory device shown in FIG. 6.

Referring to FIG. 7A, if the control gate voltage Vg is maintained at 0 V and the first voltage V1 is not applied, the electrons remain in the first, second, third and fourth charge trap layers 650, 652, 654 and 656.

Figure 7B:
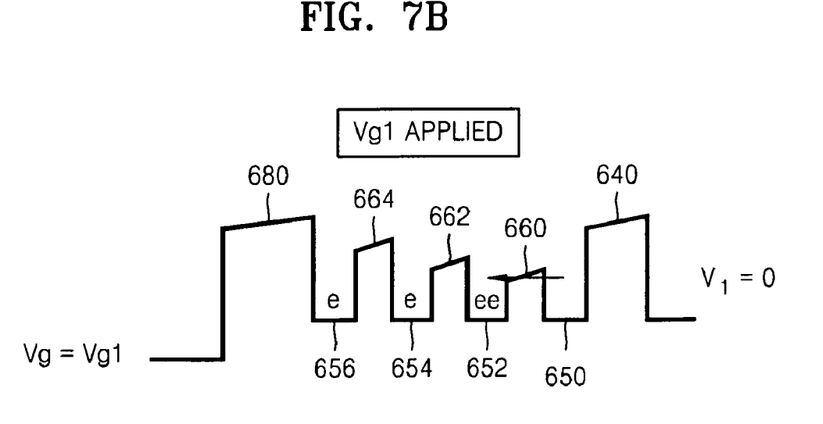

Referring to FIG. 7B, if the control gate voltage Vg and the first voltage V1 are applied, the electrons in the first charge trap layer 650 tunnel through the first pad oxide layer 660. As such, the electrons in the first charge trap layer 650 may be moved to the second charge trap layer 652.

Figure 7C:
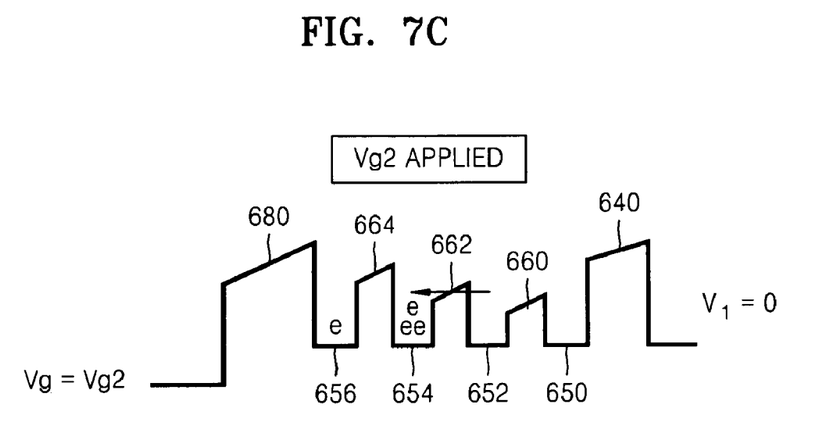

Referring to FIG. 7C, if the control gate voltage Vg is increased, the electrons in the second charge trap layer 652 tunnel through the second pad oxide layer 662 to the third charge trap layer 654.

Figure 7D:
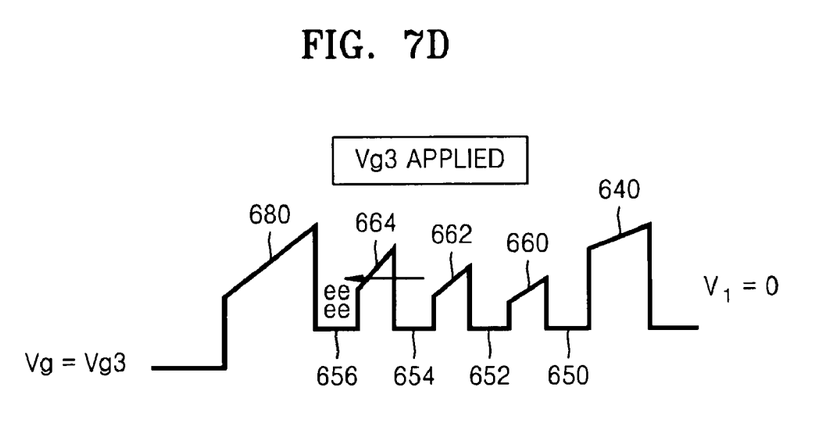

Referring to FIG. 7D, if the control gate voltage Vg is further increased, the electrons in the second charge trap layer 654 tunnel through the third pad oxide layer 664 to the fourth charge trap layer 656.

The number of charge trap layers in the non-volatile memory device according example embodiments is not limited to two or four. The non-volatile memory device may include n (wherein n is a natural number) charge trap layers and n−1 pad oxide layers. The non-volatile memory device may move electrons between a first edge (or a second edge) of an $i_{th}$ charge trap layer and a first edge (or a second edge) of an $i+1_{th}$ charge trap layer through an $i_{th}$ pad oxide layer (wherein i is a natural number and the expression i≦n−1 is satisfied). As such, electrons may be separately moved between the first edge and the second edge of adjacent charge trap layers.

The non-volatile memory device according to example embodiments may have n threshold voltages of the first edge and n threshold voltages of the second edge. The non-volatile memory device may store $2^n$-bit data.

As described above, in the non-volatile memory devices and the methods of programming thereof according to example embodiments, programming is performed by charge transition thorough a pad oxide layer. As such, deterioration of a tunnel oxide layer may be reduced (or prevented) and power consumption of the non-volatile memory device may decrease.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A non-volatile memory device, comprising:
a first charge trap layer on a semiconductor substrate, wherein the first charge trap layer stores electrons;
a pad oxide layer on the first charge trap layer; and
a second trap layer on the pad oxide layer, wherein the second charge trap layer stores electrons,
wherein, in a programming mode in which data is written, stored electrons are moved or not moved between a first position of the first charge trap layer and a first position of the second charge trap layer through the pad oxide layer or between a second position of the first charge trap layer and a second position of the second charge trap layer through the pad oxide layer, respectively.

2. The device of claim 1, wherein the first and second position of the first charge trap layer is a first and second edge of the first charge trap layer, respectively,
and the first and second position of the second charge trap layer is a first and second edge of the second charge trap layer, respectively.

3. The device of claim 2, wherein according to data value,
the electrons are not moved between the first and second charge trap layers,
the electrons are moved from the first edge of the first trap layer to the first edge of the second charge trap layer,
the electrons are not moved from the second edge of the first charge trap layer to the second edge of the second charge trap layer,
or the electrons are separately moved from the first and second edges of the first charge trap layer to the first and second edges of the second charge trap layer.

4. The device of claim 2, wherein the first edge of the first and second charge trap layers correspond to a first semiconductor substrate position, the second edge of the first and second charge trap layers correspond to a second semiconductor substrate position, and a center of the semiconductor substrate corresponds to a third semiconductor substrate position.

5. The device of claim 4, wherein a first voltage is applied to one of the first, second and third semiconductor substrate positions according to a data value, wherein the first voltage is less than a control gate voltage.

6. The device of claim 5, wherein the control gate voltage is positive, the first voltage is a ground voltage, and one of the first, second and third semiconductor substrate positions, to which the first voltage is not applied, is floated.

7. The device of claim 4, further comprising:
a first doping region in the first semiconductor substrate position, wherein a first voltage less than a control gate voltage is applied to the first doping region to move electrons from the first edge of the first charge trap layer to the first edge of the second charge trap layer; and
a second doping region in the second semiconductor substrate position, wherein the first voltage is applied to the second doping region to move electrons from the second edge of the first charge trap layer to the second edge of the second charge trap layer,
wherein the first voltage is applied to the third semiconductor substrate position to move electrons from the first and second edges of the first charge trap layer to the first and second edges of the second charge trap layer.

8. The device of claim 7, wherein the first voltage is a ground voltage, and one of the first, second and third semiconductor substrate positions, to which the first voltage is not applied, is floated.

9. The device of claim 8, wherein the first doping region includes a first high doping region and a first low doping region; and the second doping region includes a second high doping region and a second low doping region,
wherein the first voltage is applied to the first low doping region and the second low doping region or the first low doping region and the second low doping region are floated.

10. The device of claim 2, wherein electrons are tunneled through the pad oxide layer to move the electrons between the first charge trap layer and the second charge trap layer.

11. The device of claim 2, wherein, in a reading mode in which data written in the device is read, a data value is detected according to a comparison of a first current flowing in a first direction of the semiconductor substrate with a second current flowing in a second direction opposite to the first direction.

12. The device of claim 2, further comprising a tunneling oxide layer on the semiconductor substrate and below the first charge trap layer, wherein electrons are injected through the tunneling oxide layer from the semiconductor substrate to the first charge trap layer and the second charge trap layer in an initial mode prior the programming mode.

13. The device of claim 12, wherein electrons are injected from the semiconductor substrate to the first trap layer and the second charge trap layer using channel hot electronic injection (CHEI).

14. The device of claim 12, wherein electrons are injected from the semiconductor substrate to the first edge of the first and second charge trap layers, after electrons are injected from the semiconductor substrate to the second edge of the first and second charge trap layers.

15. The non-volatile memory device of claim 2, further comprising:
a plurality of charge trap layers ($n_{th}$) sequentially on the semiconductor substrate, wherein n is a natural number; and
a plurality of pad oxide layers ($n-1_{th}$) respectively between adjacent layers of the plurality of charge trap layers,
wherein, in the programming mode in which the data is written, the electrons are moved or not moved between a first edge of an $i_{th}$ charge trap layer and a first edge of an $i+1_{th}$ charge trap layer through an $i_{th}$ pad oxide layer, i being a natural number and the expression i≦n−1 being satisfied, or between a second edge of the $i_{th}$ charge trap layer and a second edge of the $i+1_{th}$ charge trap layer through the $i_{th}$ pad oxide layer.

16. The device of claim 15, wherein the upper pad oxide layer is disposed, the thicker the pad oxide layer is.

17. The device of claim 15, wherein the upper pad oxide layer is disposed, the lower permittivity the pad oxide layer has.

18. A method of programming a non-volatile memory device having a pad oxide layer between a first charge trap layer and a second trap layer formed on a semiconductor substrate, the method comprising:
injecting electrons from the semiconductor substrate to first and second edges of each of the first and second charge trap layers in an initial mode; and
programming in which, the electrons are moved or not moved according to a data value in a programming mode through the pad oxide layer from the first edge of the first charge trap layer to the first edge of the second charge trap layer or through the pad oxide layer from the second edge of the first charge trap layer to the second edge of the second charge trap layer, respectively.

19. The method of claim 18, wherein in the programming, according to a data value,
the electrons are not moved between the first and second charge trap layers,
the electrons are moved from the first edge of the first trap layer to the first edge of the second charge trap layer,
the electrons are moved from the second edge of the first charge trap layer to the second edge of the second charge trap layer,
or the electrons are separately moved from the first and second edges of the first charge trap layer to the first and second edges of the second charge trap layer.

20. The method of claim 18, wherein the first edge of the first and second charge trap layers correspond to a first semiconductor substrate position, the second edge of the first and second charge trap layers correspond to a second semiconductor substrate position, and a center of the semiconductor substrate corresponds to a third semiconductor substrate position.

21. The method of claim 20, wherein, according to a data value, programming includes applying a first voltage to one of the first semiconductor substrate position, the second semiconductor substrate position and the third semiconductor substrate position, wherein the first voltage is less than a control gate voltage.

22. The method claim 21, further comprising floating one of the first, second and third semiconductor substrate positions to which the first voltage is not applied, wherein the control gate voltage is positive, and the first voltage is a ground voltage.

23. The method of claim 18, wherein programming includes tunneling electrons through the pad oxide layer to move the electrons between the first charge trap layer and the second trap layer.

24. The method of claim 18, wherein injecting includes injecting electrons from the semiconductor substrate to the first and second charge trap layers using channel hot electron injection (CHEI).

25. The method of claim 18, further comprising;
flowing a current in a positive direction on the semiconductor substrate; and
detecting data programmed based on a comparison of a first current flowing in a first direction on the semiconductor substrate with a second current flowing in a second direction opposite to the first direction.

* * * * *